US007417262B2

(12) United States Patent
Pruvost et al.

(10) Patent No.: US 7,417,262 B2
(45) Date of Patent: Aug. 26, 2008

(54) WAVEGUIDE INTEGRATED CIRCUIT

(75) Inventors: Sébastien Pruvost, Saint Ismier (FR); Jocelyn Roux, Hurtieres (FR)

(73) Assignee: STMicroelectronics S.A., Montrouge (FR)

( * ) Notice: Subject to any disclaimer, the term of this patent is extended or adjusted under 35 U.S.C. 154(b) by 98 days.

(21) Appl. No.: 11/415,445

(22) Filed: May 1, 2006

(65) Prior Publication Data

US 2006/0270210 A1 Nov. 30, 2006

(30) Foreign Application Priority Data

May 10, 2005 (FR) .................................. 05 04675

(51) Int. Cl.
*H01L 33/00* (2006.01)

(52) U.S. Cl. .......................................... 257/98; 438/31

(58) Field of Classification Search ................. 438/622, 438/618, 31; 257/773, 98, 116, 432; 343/786
See application file for complete search history.

(56) References Cited

U.S. PATENT DOCUMENTS 2,721,312 A 10/1955 Grieg et al.
2,760,169 A 8/1956 Engelmann
5,986,331 A * 11/1999 Letavic et al. ............... 257/664
6,023,206 A * 2/2000 Henderson et al. .......... 333/204
6,057,747 A * 5/2000 Takenoshita et al. ........ 333/137
6,064,350 A * 5/2000 Uchimura et al. ........... 343/786
6,380,825 B1 * 4/2002 Takenoshita et al. ........ 333/137
6,515,562 B1 * 2/2003 Takenoshita et al. ........ 333/248
6,674,168 B1 * 1/2004 Cooney et al. .............. 257/758
6,770,554 B1 * 8/2004 Welstand .................... 438/618
6,847,273 B2 * 1/2005 Shin-Hsuan et al. ........ 333/204
6,958,662 B1 * 10/2005 Salmela et al. ................ 333/26
6,982,227 B2 * 1/2006 Cooney et al. .............. 438/706
7,005,371 B2 * 2/2006 Chinthakindi et al. ....... 438/618
7,038,558 B2 * 5/2006 Higgins ...................... 333/157
7,183,580 B2 * 2/2007 Hayashi et al. ............... 257/81
7,196,421 B2 * 3/2007 Vallet ......................... 257/758
7,251,385 B2 * 7/2007 Kondo ......................... 385/14
2002/0086475 A1 * 7/2002 Havemann .................. 438/200
2003/0116851 A1 * 6/2003 Sett et al. .................... 257/758
2004/0000968 A1 * 1/2004 White et al. ................ 333/185
2004/0142565 A1 * 7/2004 Cooney et al. .............. 438/689
2005/0077540 A1 * 4/2005 Hulsmann ................... 257/189
2005/0082643 A1 * 4/2005 Kondo ........................ 257/620
2006/0138480 A1 * 6/2006 Adkisson et al. ............ 257/291

(Continued)

FOREIGN PATENT DOCUMENTS

EP 0 845 831 A2 6/1998

OTHER PUBLICATIONS

Preliminary French Search Report, FR 05 04675, dated Oct. 20, 2005.

(Continued)

*Primary Examiner*—Tuan H Nguyen
(74) *Attorney, Agent, or Firm*—Gardere Wynne Sewell LLP

(57) ABSTRACT

An integrated circuit includes many metallization levels. A thick dielectric region is placed above at least two metallization levels and laterally neighboring two or more metallization levels. That part of the two metallization levels which lie beneath the dielectric region forms a screen. A conducting strip is placed on the dielectric region so that the dielectric region forms a waveguide.

22 Claims, 5 Drawing Sheets

U.S. PATENT DOCUMENTS

2006/0220078 A1 * 10/2006 Bui et al. .................... 257/292

OTHER PUBLICATIONS

Uchimura, et al., Institute of Electrical and Electronics Engineers: "Development of the Laminated Waveguide," 1998 IEEE MTT-S International Microwave Symposium Digest, IMS '98; Progress Through Microwaves, Baltimore, MD, Jun. 7-12, 1998, IEEE MT-S International Microwave Symposium Digest, New York, NY, IEEE, US, vol. vol. 3, Jun. 7, 1998, pp. 1811-1814; XP0002139760; ISBN: 0-7803-4472-3.

* cited by examiner

WAVEGUIDE INTEGRATED CIRCUIT

PRIORITY CLAIM

The present application claims priority from French Application for Patent No. 05 04675 filed May 10, 2005, the disclosure of which is hereby incorporated by reference.

BACKGROUND OF THE INVENTION

1. Technical Field of the Invention

The present invention relates to the field of integrated circuits, more particularly to integrated circuits equipped with waveguides for the propagation of radio waves, for example at frequencies above 1 GHz and possibly up to several tens or several hundreds of GHz.

2. Description of Related Art

As known per se, an integrated circuit comprises a substrate, either a bulk substrate or a substrate on an insulator, in which are formed active parts, especially transistors, and a set of interconnections on top of the substrate. The set of interconnections comprises a plurality of metallization levels, each provided with conducting lines lying in a plane, and a plurality of dielectric layers alternating with the metallization layers and penetrated by conducting vias providing electrical connection between two adjacent metallization levels. This type of integrated circuit is designed for the transmission of electrical signals and is ill suited for the transmission of electromagnetic waves.

There is a need to be able to form a waveguide having a low signal attenuation constant and an advanced technology integrated circuit.

SUMMARY OF THE INVENTION

An integrated circuit in accordance with the invention comprises a plurality of metallization levels and of dielectric layers. One metallization level is placed between two dielectric layers. A thick dielectric region is placed above at least two metallization levels and laterally neighboring a plurality of metallization levels. That part of the two metallization levels which lies beneath the dielectric region forms a screen. A conducting strip is placed on the dielectric region, so that the dielectric region forms a waveguide. The dielectric region is surrounded on three sides by metallization levels and on the upper side by the conducting strip. This provides for a concentration for the magnetic field lines in the dielectric region and excellent transmission of the signal in said dielectric region.

Advantageously, said part of the two metallization levels which lies beneath the dielectric region is grounded. A plurality of vias may be placed between said parts of the two metallization levels which lie beneath the dielectric region. Vias formed in a dielectric layer electrically connect two adjacent metallization levels and improve the equipotentialization of said part of the two metallization levels which lies beneath the dielectric region.

Advantageously, the metallization levels laterally neighboring the dielectric region are grounded. A plurality of vias may be placed between said metallization levels laterally neighboring the dielectric region.

In one embodiment, said part of the two metallization levels which lies beneath the dielectric region comprises a plurality of similar metal elements connected to one another in rows and columns. The waveguide thus benefits from an equipotential screen. The metallization levels laterally neighboring the dielectric region may comprise a plurality of similar metal elements connected to one another in rows and columns.

In one embodiment, said part of the two metallization levels which lies beneath the dielectric region comprises metal elements providing a complete overlap. In other words, no field line of straight shape can directly connect the thick dielectric region and an element placed under that part of the two metallization levels which lies beneath the dielectric region, for example a substrate. The attenuation of the signal during its propagation in the waveguide is thus reduced.

In one embodiment, the dielectric region extends parallel to the conducting strip and has a width of more than three times that of the conducting strip, or at least one times the height of said thick dielectric region.

In one embodiment, the dielectric region is placed laterally neighboring at least four metallization levels.

In one embodiment, the conducting strip comprises a copper based lower part in contact with the thick dielectric region and an aluminum based upper part, of width substantially equal to the copper based part. Alternatively, the conducting strip may comprise a single metal strip element. The conducting strip may be placed at the sixth or seventh metallization level. The upper metallization level may have a thickness greater than that of the other metallization levels. The metallization levels present beneath the thick dielectric region each comprise elements connected to at least three adjacent similar elements. The elements of each of said metallization levels present beneath the thick dielectric region have complementary shapes in order to entirely cover the substrate and prevent field lines from extending directly between the waveguide forming thick dielectric region and the substrate. A dielectric layer may be placed between the substrate and the first metallization level. The attenuation of the signal in the waveguide is reduced.

Advantageously, the elements of at least one part of the metallization levels are in the form of one or more hollow metal squares formed around a square of dielectric material. The elements of one of the metallization levels which lie beneath the thick dielectric region may be in the form of a solid square, having smaller dimensions than the hollow square, and are connected to the adjacent solid square by narrow segments. Furthermore, vias placed substantially in the form of a square may connect the solid square of one metallization level to the corresponding hollow square of an adjacent metallization level.

The presence of metallized elements in the upper metallization levels is desirable for fabrication reasons, facilitating the polishing steps which require that the local metal density be relatively constant over an entire integrated circuit wafer. The metallized elements of the upper metallization levels, which are grounded, further provide excellent protection against the desirable field lines that extend between the thick dielectric region and other elements of the integrated circuit, thus favoring good signal propagation.

In accordance with another embodiment, an integrated circuit comprises a plurality of stacked and insulator separated metallization levels including first and second groups of plural metallization levels wherein a trench is formed through the second group of metallization levels. A plurality of vias electrically interconnect the plurality of metallization levels. A thick dielectric region fills the trench, and a conducting strip is placed within the thick dielectric region and extending along a length of the trench.

In accordance with another embodiment, an integrated circuit comprises a first group of insulator separated metallization levels, wherein each level is formed by adjacent first tiles, each first tile having a generally square shape with rectangular recesses on each side, and a second group of insulator separated metallization levels, overlying the first group of insulator separated metallization levels, wherein each level is formed by adjacent second tiles, each second tile having a generally square shape with a generally square recess in a center thereof. A dielectric region fills a trench formed in the second group of insulator separated metallization levels. A conducting strip narrower than a width of the trench is placed within the dielectric region and extends along a length of the trench.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE PREFERRED EMBODIMENTS

Figure 1:
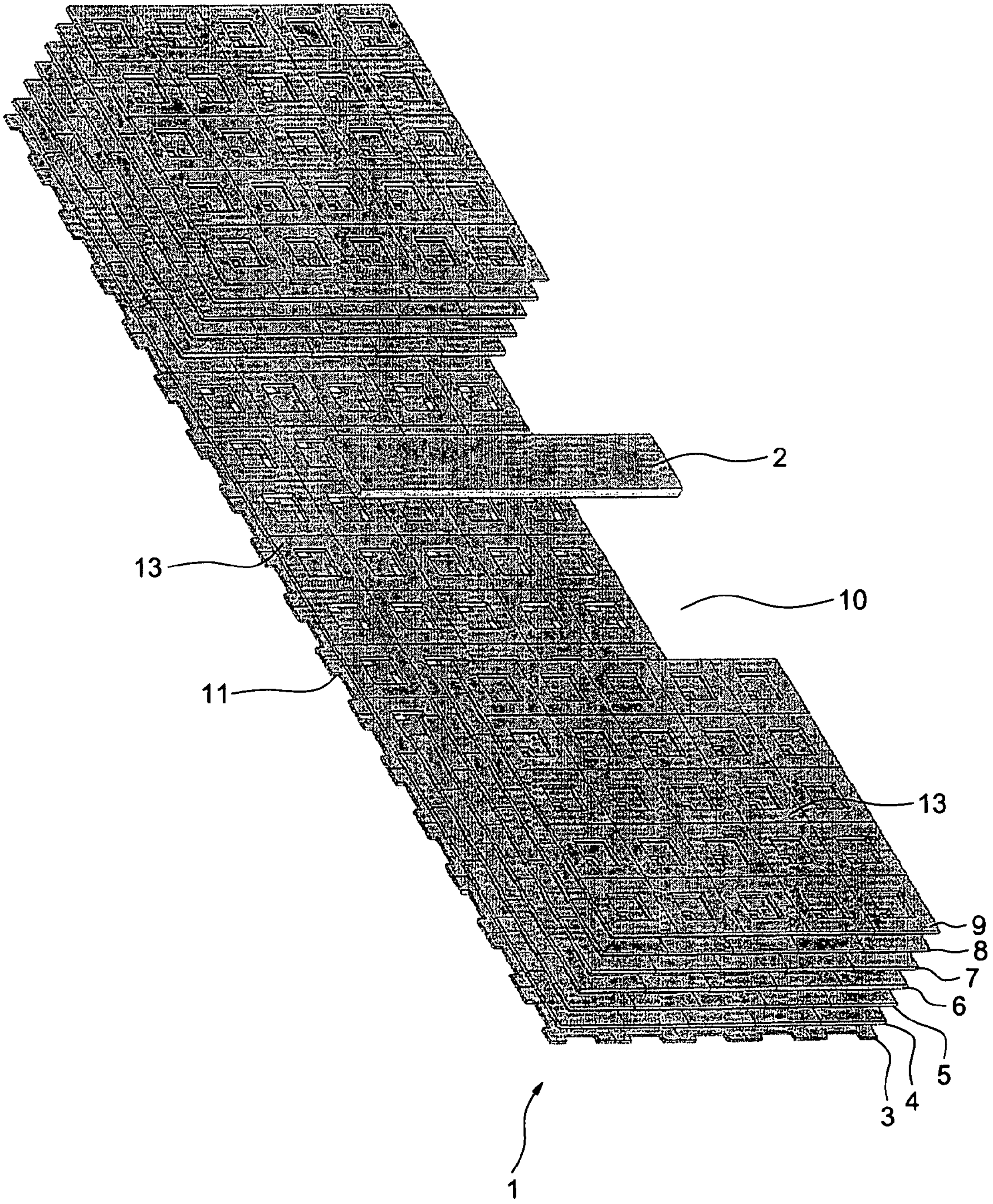
FIG. 1 is a schematic sectional view of an integrated circuit according to a first embodiment.

As may be seen in FIG. 1, only the metal parts of the metallization levels have been shown. The integrated circuit referenced 1 in its entirety comprises a plurality of metallization levels and a conducting strip 2. The metallization levels here are seven in number and bear the references 3 to 9. The conducting strip 2 is formed at the metallization level 9 and may comprise copper.

Figure 4:
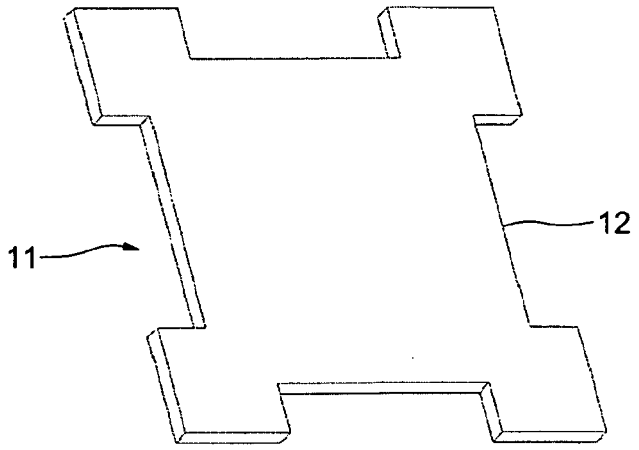
FIG. 4 is a schematic perspective view of an elementary feature, arbitrarily of the first metallization level.

The metallization levels 3 and 4 comprise a part placed beneath the conducting strip 2. In contrast, the metallization levels 5 to 9 are interrupted at the conducting strip 2 and leave behind a channel shaped volume 10. In other words, the volume 10 is bounded at the bottom by the metallization level 4, laterally by the edges of the metallization levels 5 to 9 and at the top by the conducting strip 2. However, the conducting strip 2 has a substantially smaller width than that of the volume 10. The volume 10 is filled with dielectric material. Each metallization level comprises a plurality of metal elements (or tiles) that may or may not be identical for any one metallization level. The metallization level 3 comprises metal elements 11, these being illustrated in greater detail in FIG. 4.

The metal element 11 has a general tile shape that lies within a square and has rectangular recesses 12 formed on each side, these recesses extending over approximately one half of the length of the side, being centered and having a depth of around 10 to 25% of the length. In other words, the metal element 11 is in the form of a square, the middles of the sides of which are provided with relatively shallow elongate notches.

Figure 5:
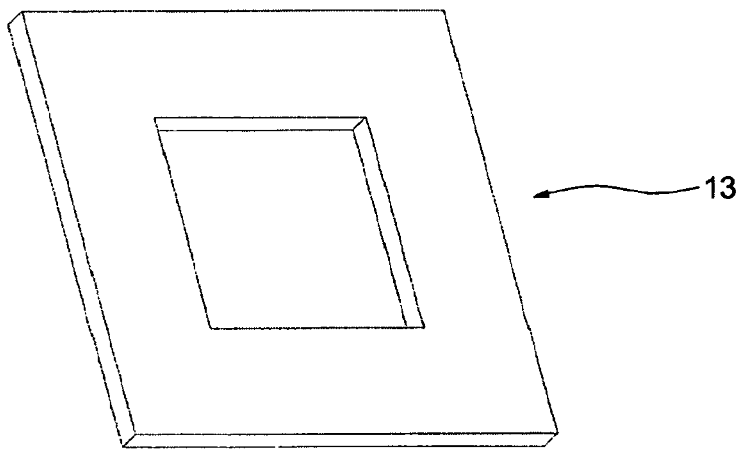
FIG. 5 is a schematic perspective view of an elementary feature of the other metallization levels.

The metallization levels 4 to 9 are provided with metal elements 13, these being illustrated in greater detail in FIG. 5. The metal element 13 has a general tile shape and is a hollow feature bounded by two concentric squares, the inner square having sides of length around one half of the length of the outer square. The metal elements 11 or 13 of two adjacent metallization levels are vertically aligned in the sense that their outer edges are contained in the same plane. By translating this plane, it is possible to obtain the alternative embodiments of the basic shapes given for example so as to illustrate the detailed description.

The metal elements 11 of the metallization level 3 are electrically connected together by their arrow shaped corners. The metal elements 13 of each metallization level 4 to 9 are electrically connected together by their outer edges. The metal elements 11 and 13 may be based on copper.

Figure 6:
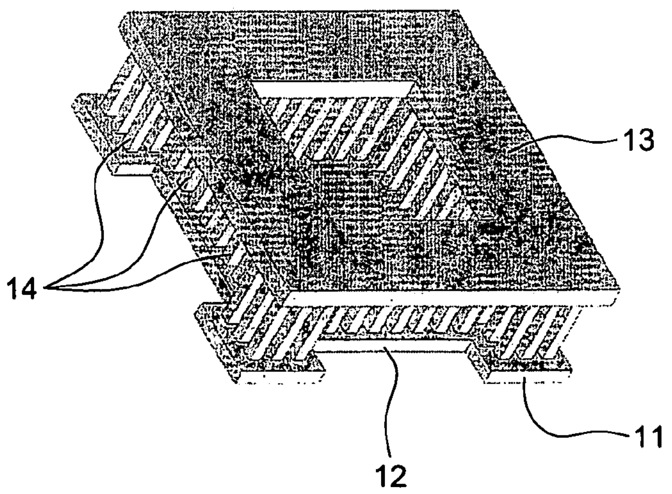
FIG. 6 is a schematic perspective view of the elementary features of FIGS. 4 and 5 connected together by vias.

As may be seen in FIG. 6, a plurality of vias 14, for example based on copper, electrically connect the metal elements of two adjacent metallization levels. The vias 14 are arranged in large numbers so as to ensure high quality equipotentiability between two adjacent metallization levels, even at high frequency, and are placed in an arrangement corresponding to the surfaces common to the metal elements of the two adjacent metallization levels.

In the case illustrated in FIG. 6, the vias 14 are placed between the metal element 11 of the metallization level 3 and the metal element 13 of the metallization level 4. The vias 14 are therefore provided between the external outline of the metal element 11 and the internal outline of the metal element 13, thus defining a larger surface common to the metal element 11 and to the metal element 13, taking into account the notches 12 and internal recess of the metal element 13. The vias placed between two metal elements 13, which are identical for two adjacent metallization levels taken from among the metallization levels 4 to 9, are placed over the entire surface of said metal elements 13.

The vias 14 are arranged in rows and columns for reasons of simplicity of illustration of the drawing of said metallization levels. Likewise, for fabrication economics and simplicity reasons, the metal elements of the various metallization levels have edges formed from a succession of mutually perpendicular segments.

Referring to FIG. 1, in which the vias and the dielectric layers have not been shown in order to display the metallization levels better, it may be seen that an equipotential assembly is formed by the metallization levels represented, namely the metallization levels 3 and 4 placed over the entire surface portion shown, and the metallization levels 5 to 9 formed laterally a certain distance away from the conducting strip 2 and thus defining a volume in which the dielectric region 10 is formed. The dielectric region, in combination with the metal elements of the metallization levels 3 to 9 and the conducting strip 2, forms a particularly effective waveguide, especially for radio frequency applications.

The fact that the metal elements do not occupy the entire surface that is allocated to them, but are provided with notches in the case of some of them and with central recesses in the case of the others, makes it possible to reduce the ratio of the metallized area to the total area in question and consequently reduces the variations in this ratio in comparison with other regions of the integrated circuit in which a smaller amount of metal is used. The polishing steps are facilitated.

The fact of providing the metal elements 11 and 13 of the first metallization levels 3 and 4 with different shapes makes it possible to ensure excellent coverage of the two metallization levels 3 and 4. In other words, no magnetic field line can pass through the metallization levels 3 and 4 directly along a straight line perpendicular to said metallization levels without encountering a metallized surface. Thus, an excellent magnetic screen is formed between the volume 10 and other elements of the integrated circuit that are formed below the metallization level 3, these not having been shown in FIG. 7, for example active parts formed in a bulk substrate or placed on an insulator. Thus, the signal losses within the waveguide are limited.

Furthermore, the fact of placing the bottom and the edges of the volume 10 that are formed by the various metallization levels 3 to 9 at the same potential, thanks to the mutual contact of the edges of the metallized elements 11 and 13 and to the contact between the adjacent metallization levels by means of vias 14, makes it possible, here again, to improve the transmission of waves in the waveguide.

Figure 2:
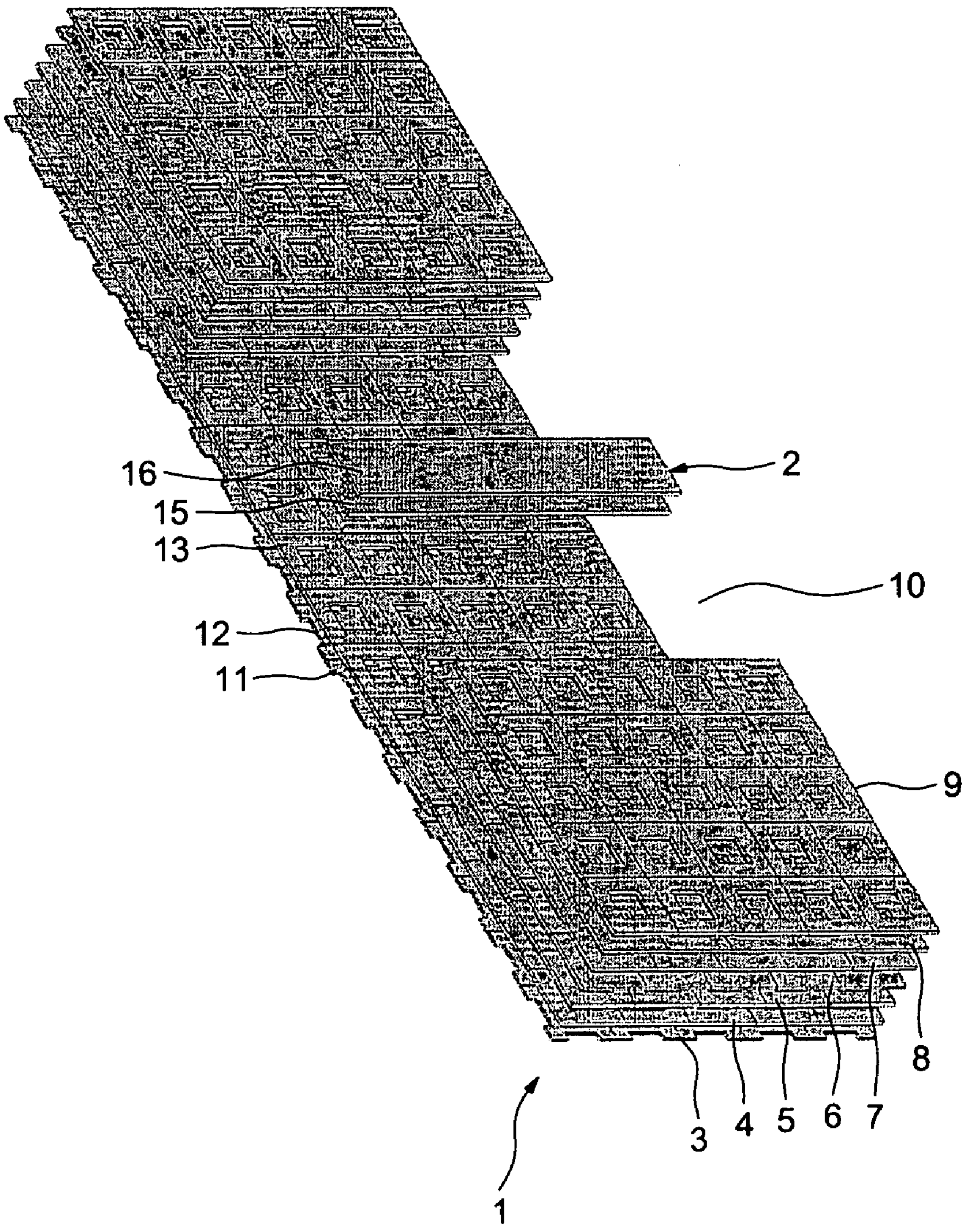
FIG. 2 is a schematic sectional view of an integrated circuit according to a second embodiment.

In the embodiment illustrated in FIG. 2, the references of the similar elements have been repeated. The conducting strip 2 comprises two superposed strip elements 15 and 16 that may either be directly connected by vias or are in indirect contact with each other. The lower strip element 15 may lie in the same plane as the metallization level 9 and based for example on copper. The upper strip element 16 may be based on aluminum. Thus, there is excellent conductivity of the conducting strip 2, while making it easier to contact the conducting strip 2 with elements (not shown) placed above the conducting strip 2 and generally based on aluminum, especially external contacts.

Figure 3:
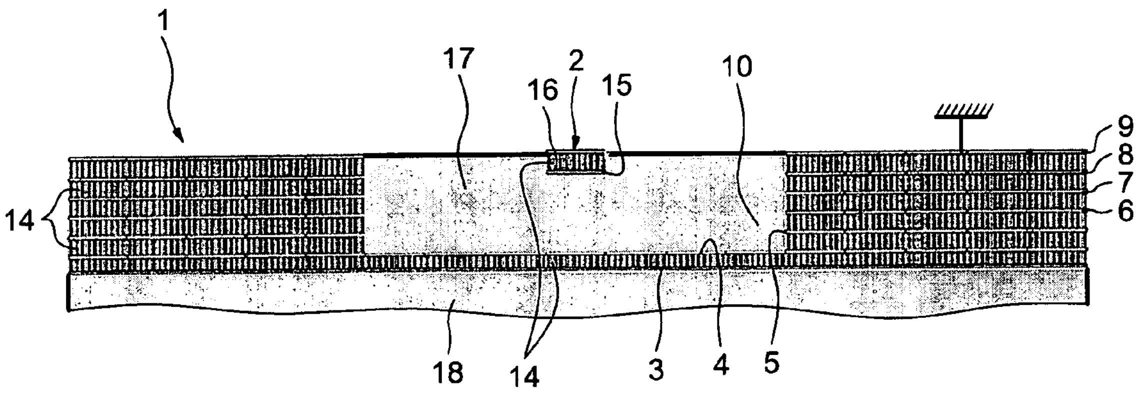
FIG. 3 is a vertical sectional view of the integrated circuit of FIG. 2.

FIG. 3 is a sectional view in a vertical plane of the integrated circuit illustrated in FIG. 2. The vias 14 have been shown in FIG. 3, as have the thick dielectric region 17 placed in the volume 10 and the dielectric layer 18 placed beneath the metallization level 3. Outside the zone of the thick dielectric layer 17 formed in the volume 10, the metallization levels 3 to 9 are particularly well connected pair-wise by the very large number of vias 14 placed each time between two superposed metal elements of two adjacent metallization levels. Beneath the thick dielectric region 17, the metallization levels 3 and 4 are also particularly well connected by the vias 14 and furthermore form a screen against the magnetic field lines capable of extending from the thick dielectric region 17 towards the lower dielectric layer 18.

Figure 7:
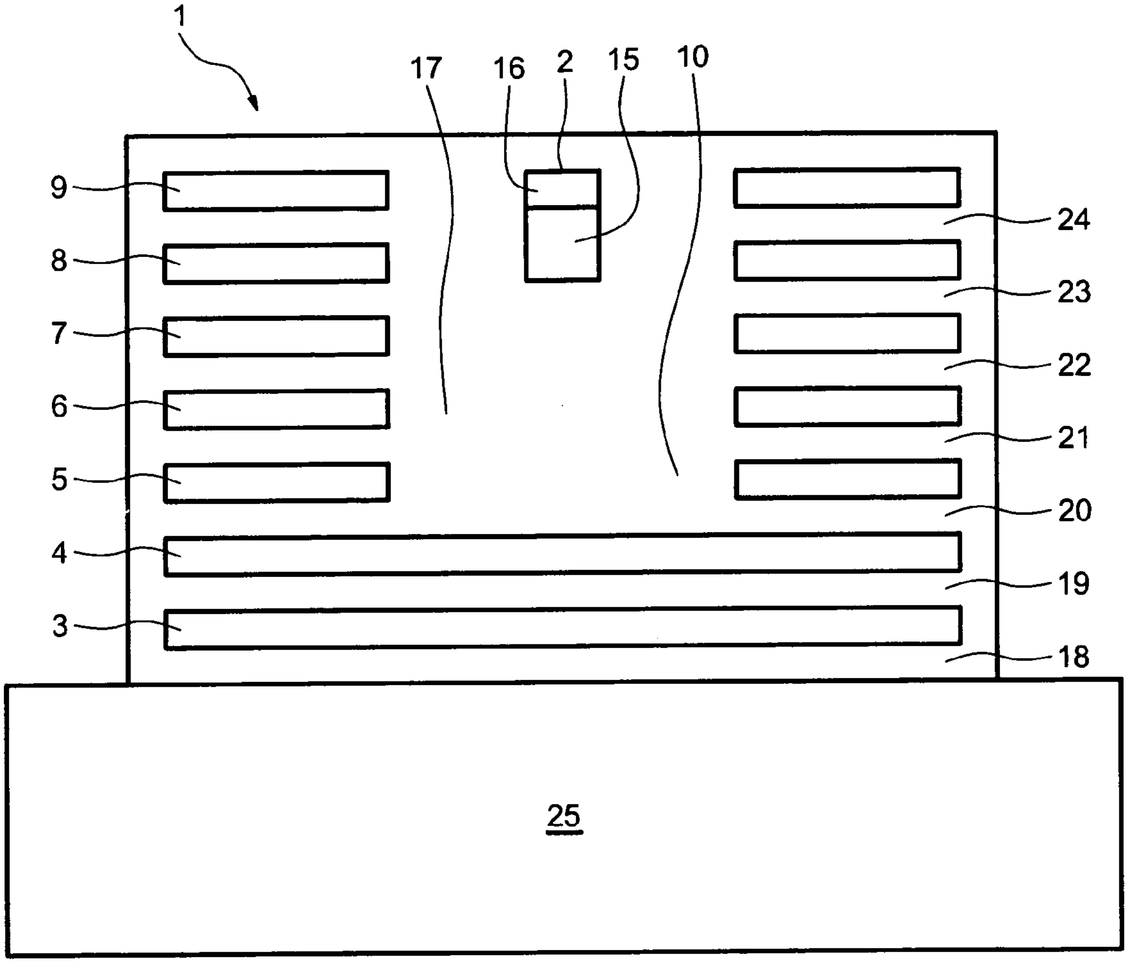
FIG. 7 is a schematic sectional view of an integrated circuit according to a third embodiment.

In the embodiment illustrated in FIG. 7, the conducting strip 2 comprises two strip elements 15 and 16 in mutual contact, these being formed at the same level as the metallized layers 8 and 9. Dielectric layers 19 to 24 are placed between the metallization levels. The vias have not been shown. The dielectric layer 18 is formed on a substrate 25.

Thus, a waveguide with a low signal attenuation is formed, especially thanks to the screen formed between the thick dielectric region and the substrate and thanks to the equipotentialization of the bottom and of the edges of the channel.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit, comprising:

a plurality of metallization levels and of dielectric layers, one metallization level being placed between two dielectric layers;

a thick dielectric region placed above at least two of the metallization levels and laterally neighboring others of the metallization levels and filled with a dielectric material, a part of the two metallization levels which lies beneath the thick dielectric region forming a screen; and a conducting strip placed within the dielectric region and supported by the dielectric material filling so that the dielectric region forms a waveguide.

2. The integrated circuit according to claim 1, in which said part of the two metallization levels which lies beneath the dielectric region is grounded.

3. The integrated circuit according to claim 1, in which a plurality of vias are placed between said two metallization levels which lie beneath the dielectric region.

4. The integrated circuit according to claim 1, in which the others of the metallization levels laterally neighboring the dielectric region are grounded.

5. The integrated circuit according to claim 4, in which a plurality of vias are placed between said others of the metallization levels laterally neighboring the dielectric region.

6. The integrated circuit according to claim 1, in which each individual one of the two metallization levels which lies beneath the dielectric region comprises a plurality of similar metal elements connected to one another in rows and columns.

7. The integrated circuit according to claim 1, in which each individual one of the others of the metallization levels laterally neighboring the dielectric region comprises a plurality of similar metal elements connected to one another in rows and columns.

8. The integrated circuit according to claim 1, in which said part of the two metallization levels which lies beneath the dielectric region comprises metal elements providing a complete overlap.

9. The integrated circuit according to claim 1, in which the dielectric region extends parallel to the conducting strip and has a width of more than three times a width of the conducting strip.

10. The integrated circuit according to claim 1, in which the dielectric region extends parallel to the conducting strip and has a width of at least one times a height of said thick dielectric region.

11. The integrated circuit according to claim 1, in which the dielectric region is placed laterally neighboring at least four metallization levels.

12. The integrated circuit according to claim 1, in which the conducting strip comprises a single metal strip element.

13. The integrated circuit according to claim 1, in which the conducting strip comprises at least two equipotential superposed strip elements based on different materials.

14. An integrated circuit, comprising:

a plurality of stacked and insulator separated metallization levels including first and second groups of plural metallization levels wherein a trench is formed through the second group of metallization levels;

a plurality of vias electrically interconnecting the plurality of metallization levels;

a thick dielectric material filling the trench;

a conducting strip placed within and supported by the thick dielectric material and extending along a length of the trench to form a waveguide.

15. The circuit of claim 14 wherein the conducting strip comprises first and second overlying strip elements.

16. The circuit of claim 15 wherein the first and second overlying strip elements directly contact each other.

17. The circuit of claim 15 wherein the first and second overlying strip elements are separated by dielectric and are electrically interconnected by vias.

18. The circuit of claim 15 wherein the first and second overlying strip elements are separated by a dielectric material.

19. The circuit of claim 15 wherein each individual one of the first group of plural metallization levels is formed from a plurality of adjacent tile segments, each tile segment having a generally square shape with rectangular recesses on each side.

20. The circuit of claim 15 wherein each individual one of the second group of plural metallization levels is formed from a plurality of adjacent tile segments, each tile segment having a generally square shape with a generally square recess in a center thereof.

21. An integrated circuit, comprising:

a first group of insulator separated metallization levels, wherein each level is formed by adjacent first tiles, each first tile having a generally square shape with rectangular recesses on each side;

a second group of insulator separated metallization levels, overlying the first group of insulator separated metallization levels, wherein each level is formed by adjacent second tiles, each second tile having a generally square shape with a generally square recess in a center thereof;

a dielectric region filling a trench formed in the second group of insulator separated metallization levels; and a conducting strip narrower than a width of the trench, placed within the dielectric region and extending along a length of the trench.

22. The integrated circuit of claim 21 wherein the conductive strip and metallization levels form a waveguide.

* * * * *